United States Patent
Li et al.

(10) Patent No.: US 10,727,864 B2
(45) Date of Patent: Jul. 28, 2020

(54) SERVER AND METHOD FOR COMPRESSING DATA BY DEVICE

(71) Applicant: HUAWEI TECHNOLOGIES CO., LTD., Shenzhen, Guangdong (CN)

(72) Inventors: Fulu Li, Shenzhen (CN); Enting Cai, Shenzhen (CN); Chungong Lin, Chengdu (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 163 days.

(21) Appl. No.: 15/909,704

(22) Filed: Mar. 1, 2018

(65) Prior Publication Data

US 2018/0191370 A1 Jul. 5, 2018

Related U.S. Application Data

(63) Continuation of application No. PCT/CN2015/099577, filed on Dec. 29, 2015.

(51) Int. Cl.
*H03M 7/30* (2006.01)
*G06F 16/174* (2019.01)
(Continued)

(52) U.S. Cl.
CPC ...... *H03M 7/3059* (2013.01); *G06F 16/1744* (2019.01); *H03M 7/30* (2013.01);
(Continued)

(58) Field of Classification Search
CPC .................. H03M 7/3059; G06F 16/1744
See application file for complete search history.

(56) References Cited

U.S. PATENT DOCUMENTS

| 5,038,392 A | 8/1991 | Morris et al. |
| 5,600,316 A * | 2/1997 | Moll ...................... G06T 9/005 |
| | | 341/87 |

(Continued)

FOREIGN PATENT DOCUMENTS

| CN | 101075237 A | 11/2007 |
| CN | 102185611 A | 9/2011 |

(Continued)

OTHER PUBLICATIONS

Google Scholar Search Results.*
(Continued)

*Primary Examiner* — Qun Shen
(74) *Attorney, Agent, or Firm* — Womble Bond Dickinson (US) LLP (57) ABSTRACT

A device and a method for compressing data by a device are provided, which relate to the storage field and are used to resolve a prior-art problem that a compression ratio at which data in a data block is compressed by a device is relatively low. The method includes: parsing, by a device, an information block in a data block, to obtain a file type of data in the data block and a data sub-block that is included in the data block; determining a characteristic of data in the data sub-block according to the file type; selecting, according to the characteristic, a target compression algorithm that is used to compress the data in the data sub-block; and compressing the data in the data sub-block by using the target compression algorithm. Embodiments of the present disclosure are used to compress data.

8 Claims, 5 Drawing Sheets

(51) Int. Cl.
  *H04L 29/08* (2006.01)
  *H04L 29/06* (2006.01)
(52) U.S. Cl.
  CPC ......... *H03M 7/607* (2013.01); *H03M 7/6064* (2013.01); *H04L 29/08* (2013.01); *H04L 69/04* (2013.01)

(56) References Cited

U.S. PATENT DOCUMENTS

| | | | |
|---|---|---|---|
| 6,253,264 B1* | 6/2001 | Sebastian | G06T 9/005 |
| | | | 341/107 |
| 2002/0097172 A1 | 7/2002 | Fallon | |
| 2007/0096954 A1* | 5/2007 | Boldt | H04N 19/176 |
| | | | 341/50 |
| 2009/0234966 A1* | 9/2009 | Samuels | H03M 7/3084 |
| | | | 709/231 |
| 2009/0300015 A1 | 12/2009 | Kazan et al. | |
| 2010/0250610 A1 | 9/2010 | Kanawa | |
| 2011/0179341 A1* | 7/2011 | Falls | H03M 7/3086 |
| | | | 714/807 |
| 2011/0202509 A1 | 8/2011 | He et al. | |
| 2011/0295817 A1 | 12/2011 | Chandrasekar et al. | |
| 2013/0088373 A1 | 4/2013 | Takano | |
| 2013/0275396 A1* | 10/2013 | Condict | H03M 7/30 |
| | | | 707/693 |
| 2014/0022098 A1* | 1/2014 | Fallon | G06T 9/00 |
| | | | 341/87 |
| 2014/0223029 A1 | 8/2014 | Bhaskar et al. | |

FOREIGN PATENT DOCUMENTS

| | | |
|---|---|---|
| CN | 102638579 A | 8/2012 |
| CN | 102761540 A | 10/2012 |
| CN | 102982046 A | 3/2013 |
| CN | 103688259 A | 3/2014 |
| JP | H04359315 A | 12/1992 |
| JP | H06139325 A | 5/1994 |
| JP | H1079860 A | 3/1998 |
| JP | 2001526853 A | 12/2001 |
| JP | 2004112497 A | 4/2004 |
| JP | 2010224883 A | 10/2010 |
| JP | 2013085071 A | 5/2013 |
| WO | 02093358 A1 | 11/2002 |

OTHER PUBLICATIONS

Facebook Data Warehouse Secret RCFile efficient storage structure, Programmer magazine—(Apr. 29, 2011).With English translation. Total 18 pages.

* cited by examiner

CONT.
FROM
FIG. 4A

| The storage device determines a characteristic of data in the first data sub-block and a characteristic of data in the second data sub-block | S407 |

| The storage device determines a set of a first candidate compression algorithm corresponding to the characteristic of the data in the first data sub-block, and a set of a second candidate compression algorithm corresponding to the characteristic of the data in the second data sub-block | S408 |

| The storage device selects, from the set of the first candidate compression algorithm, a first target compression algorithm that is used to compress the data in the first data sub-block; and selects, from the set of the second candidate compression algorithm, a second target compression algorithm that is used to compress the data in the second data sub-block | S409 |

| The storage device compresses the data in the first data sub-block by using the first target compression algorithm, compresses the data in the second data sub-block by using the second target compression algorithm, and writes the compressed data into the storage medium | S410 |

SERVER AND METHOD FOR COMPRESSING DATA BY DEVICE

CROSS-REFERENCE TO RELATED APPLICATIONS

This application is a continuation of International Application No. PCT/CN2015/099577, filed on Dec. 29, 2015, the disclosure of which is hereby incorporated by reference in its entirety.

TECHNICAL FIELD

The present disclosure relates to the storage field, and in particular, to a server and a method for compressing data by a device.

BACKGROUND

At present, to save storage space, servers generally all support compression of stored data.

In the prior art, a server uses a preset compression algorithm to compress data in a data block, for example, the server uses a dictionary compression algorithm. In this case, the server scans data in a data block byte by byte to determine a character string that occurs consecutively and repeatedly in the data block, and compresses the character string that occurs consecutively and repeatedly.

It can be learned from the foregoing that the server can use only one compression algorithm to compress only data with a particular characteristic in the data block. Therefore, a compression ratio at which the data in the data block is compressed is relatively low in the prior art.

SUMMARY

An objective of the present disclosure is to provide a server and a method for compressing data by a server, which are used to resolve a prior-art problem that a compression ratio at which data in a data block is compressed by a server is relatively low.

To achieve the foregoing objective, the present disclosure uses the following technical solutions:

According to a first aspect, a method for compressing data by a server is provided, where the method includes: parsing, by the server, an information block in a data block, to obtain a file type of data in the data block and a data sub-block that is included in the data block; determining a characteristic of data in the data sub-block according to the file type; selecting, according to the characteristic, a target compression algorithm that is used to compress the data in the data sub-block; and compressing the data in the data sub-block by using the target compression algorithm.

By using the foregoing method, for data with different characteristics in a data block, a server may use different compression algorithms for compression. Compared with the prior art in which the server can use only one compression algorithm to compress data with a particular characteristic in the data block, a compression ratio for the data in the data block is improved in this embodiment of the present disclosure.

With reference to the first aspect, in a first possible implementation manner of the first aspect, the determining a characteristic of data in the data sub-block according to the file type includes: querying for a mapping relationship between the file type and the characteristic of the data in the data sub-block, to determine the characteristic of the data in the data sub-block, where the mapping relationship is configured by the server according to a data structure format of an application. It should be noted that, the data structure format of the application refers to a characteristic of data with different file types and storage locations of data with a same file type and different characteristics in the data block, where the characteristic and the storage locations are defined by the application. In this way, the server can configure, according to the data structure format of the application, a mapping relationship between a file type and a characteristic of data in a data sub-block that is included in a data block in which data of this file type is stored.

With reference to the first aspect or the first possible implementation manner of the first aspect, in a second possible implementation manner of the first aspect, the selecting, according to the characteristic, a target compression algorithm that is used to compress the data in the data sub-block includes: determining multiple candidate compression algorithms corresponding to the characteristic; and selecting the target compression algorithm from the multiple candidate compression algorithms.

With reference to the second possible implementation manner of the first aspect, in a third possible implementation manner of the first aspect, the selecting the target compression algorithm from the multiple candidate compression algorithms includes: pre-compressing the data in the data sub-block by using each candidate compression algorithm of the multiple candidate compression algorithms; obtaining compression efficiency of pre-compressing, by using each candidate compression algorithm, the data in the data sub-block; and selecting a candidate compression algorithm with highest compression efficiency as the target compression algorithm. In this way, it is ensured that compression efficiency is the highest by using a compression algorithm that is finally selected for compressing the data in the data sub-block.

According to a second aspect, a server is provided, including: a parsing unit, configured to parse an information block in a data block, to obtain a file type of data in the data block and a data sub-block that is included in the data block; a first determining unit, configured to determine a characteristic of data in the data sub-block according to the file type; a second determining unit, configured to select, according to the characteristic, a target compression algorithm that is used to compress the data in the data sub-block; and a compression unit, configured to compress the data in the data sub-block by using the target compression algorithm.

With reference to the second aspect, in a first possible implementation manner of the second aspect, the server further includes: a first configuration unit, configured to configure a mapping relationship between the file type and the characteristic of the data in the data sub-block according to a data structure format of an application; and the first determining unit is specifically configured to query for the mapping relationship between the file type and the characteristic of the data in the data sub-block, to determine the characteristic of the data in the data sub-block.

With reference to the second aspect or the first possible implementation manner of the second aspect, in a second possible implementation manner of the second aspect, the server further includes: a second configuration unit, configured to configure a correspondence between the characteristic and multiple candidate compression algorithms; and the second determining unit is specifically configured to: determine the multiple candidate compression algorithms corresponding to the characteristic, and select the target compression algorithm from the multiple candidate compression algorithms.

With reference to the second possible implementation manner of the second aspect, in a third possible implementation manner of the second aspect, the second determining unit is specifically configured to: pre-compress the data in the data sub-block by using each candidate compression algorithm of the multiple candidate compression algorithms; obtain compression efficiency of pre-compressing, by using each candidate compression algorithm, the data in the data sub-block; and select a candidate compression algorithm with highest compression efficiency as the target compression algorithm.

According to a third aspect, another server is provided, including: a memory, configured to store data in a data block; and a processor, configured to execute the method described in any one of the first aspect or the possible implementation manners of the first aspect.

In some possible implementation manners, the data block includes a first data sub-block and a second data sub-block, and the data sub-block includes a first data sub-block and a second data sub-block; that the server determines a characteristic of data in a data sub-block according to a file type includes: the server separately determines a characteristic of data in the first data sub-block and a characteristic of data in the second data sub-block; that the server selects, according to the characteristic, a target compression algorithm that is used to compress the data in the data sub-block includes: the server selects, according to the characteristic of the data in the first data sub-block, a first target compression algorithm that is used to compress the data in the first data sub-block, and selects, according to the characteristic of the data in the second data sub-block, a second target compression algorithm that is used to compress the data in the second data sub-block; and that the server compresses the data in the data sub-block by using the target compression algorithm includes: the server compresses the data in the first data sub-block by using the first target compression algorithm, and compresses the data in the second data sub-block by using the second target compression algorithm. It can be learned from these possible implementation manners that, for a data block that includes multiple data sub-blocks, according to this embodiment of the present disclosure, an appropriate compression algorithm may be selected for compression with respect to a characteristic of data in each data sub-block, which improves to a maximum extent a compression ratio at which data in the data block is compressed.

In some possible implementation manners, the file type includes at least one of the following: an index file type, a data file type, a log file type, or a control file type.

In some possible implementation manners, the characteristic of the data in the data sub-block includes at least one of the following: a first characteristic that is used to indicate that a quantity of single characters that occur consecutively and repeatedly in the data sub-block is greater than a first threshold, a second characteristic that is used to indicate that the data in the data sub-block increases or decreases progressively, or a third characteristic that is used to indicate that a quantity of character strings that occur consecutively and repeatedly in the data sub-block is greater than a second threshold.

BRIEF DESCRIPTION OF DRAWINGS

To describe the technical solutions in the embodiments of the present disclosure more clearly, the following briefly describes the accompanying drawings required for describing the embodiments.

DESCRIPTION OF EMBODIMENTS

The following describes the technical solutions in the embodiments of the present disclosure with reference to the accompanying drawings in the embodiments of the present disclosure.

Figure 1:
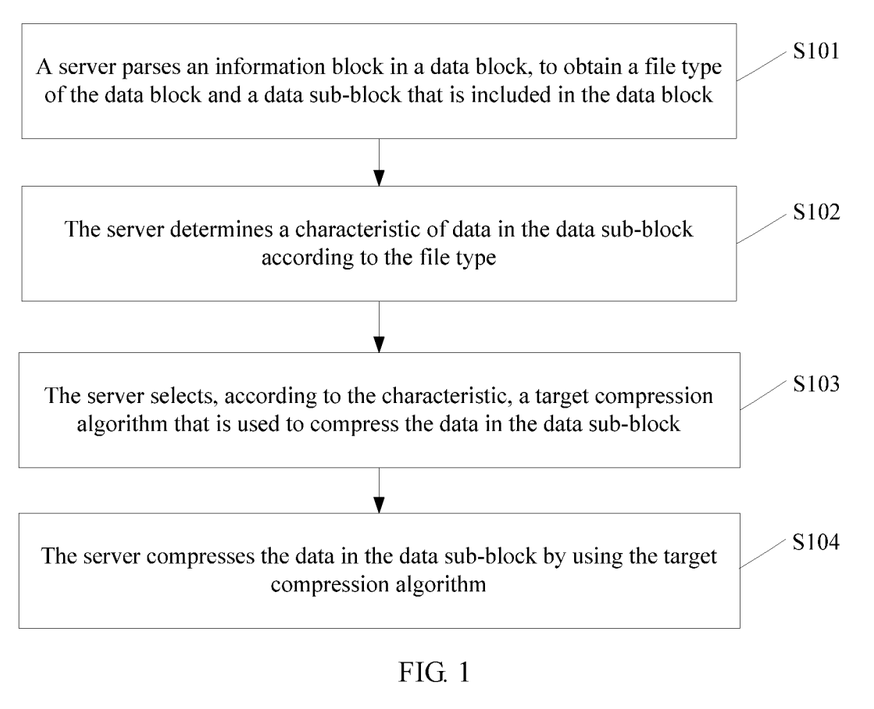
FIG. 1 is a schematic flowchart of a method for compressing data by a server according to an embodiment of the present disclosure.

An embodiment of the present disclosure provides a method for compressing data by a server. As shown in FIG. 1, the method includes the following steps:

S101. The server parses an information block in a data block, to obtain a file type of the data block and a data sub-block that is included in the data block.

It should be noted that, the information block of the data block may be a block header of the data block, where the information block is used to describe an attribute of data in the data block, and the attribute of the data includes a file type of the data stored in the data block and locations of different regions in the data block. Specifically, the information block includes a particular byte that is used to indicate the file type of the data stored in the data block. A data block of a database application is used as an example for description. If the $21^{st}$ byte in a block header of the data block is 1, it indicates that the data block stores data of a data file type. If the $21^{st}$ byte is 2, it indicates that the data block stores data of an index file type. In addition, the information block further includes bytes that are used to indicate start addresses and end addresses of different regions in the data block.

In addition, a region in the data block is a data sub-block. Data with different characteristics is located in different regions. It can be learned from the foregoing description for the information block of the data block that, the information block of the data block includes a start address and an end address of each data sub-block in the data block.

Therefore, after the server parses the information block in the data block, the file type of the data in the data block and the data sub-block that is included in the data block can be obtained.

S102. The server determines a characteristic of data in the data sub-block according to the file type.

It should be noted that, a data structure format of an application refers to a characteristic of data with different file types and storage locations of data with a same file type and different characteristics in the data block, where the characteristic and the storage locations are defined by the application. According to a definition of the application, the data with different file types may have different characteristics. That is, according to the data structure format of the application, characteristics of data in different data sub-blocks in a data block in which data of a specific file type is stored can be learned. Data of an index file type on the database application is used as an example for description. Based on a data structure format of the database application, it can be learned that, a data block in which the data of the index file type on the database application is stored generally and includes: a first data sub-block in which a single character is stored, where a quantity of the single characters that occur consecutively and repeatedly is greater than a first threshold; a second data sub-block in which data is stored, where the data increases or decreases progressively; and a third data sub-block in which a character string is stored, where a quantity of the character strings that occur consecutively and repeatedly is greater than a second threshold.

Specifically, the server may configure, according to the data structure format of the application, a mapping relationship between a file type of the application and the characteristic of the data in the data sub-block. In this way, the server can determine the characteristic of the data in the data sub-block according to the mapping relationship between the file type and the characteristic of the data in the data sub-block.

Figure 2:
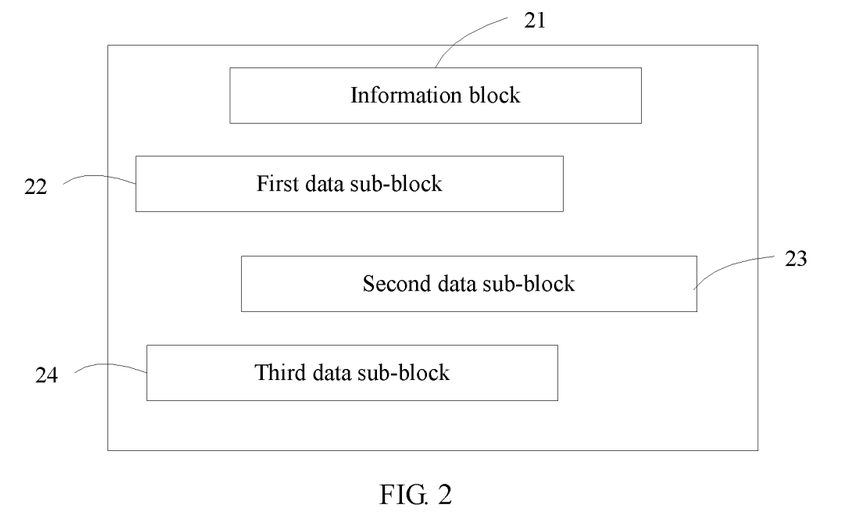
FIG. 2 is a schematic structural diagram of a data block according to an embodiment of the present disclosure.

The data of the index file type on the database application is still used as an example for description. FIG. 2 is a schematic structural diagram of a data block in which the data of the index file type on the database application is stored. As shown in the figure, the data block includes an information block 21, a first data sub-block 22, a second data sub-block 23, and a third data sub-block 24. The information block 21 includes a byte for indicating a file type of data in the data block and bytes for indicating a start address and an end address of each data sub-block of the first data sub-block 22, the second data sub-block 23, and the third data sub-block 24. The server is configured with a mapping relationship between an index file type and each of a first characteristic, a second characteristic, and a third characteristic, where the first characteristic is used to indicate that a quantity of single characters that occur consecutively and repeatedly is greater than a first threshold, the second characteristic is used to indicate that data increases progressively, and the third characteristic is used to indicate that a quantity of character strings that occur consecutively and repeatedly is greater than a second threshold. In this way, after the server, by parsing the information block 21, determines that the data in the data block belongs to the index file type, and determines specific locations of the first data sub-block 22, the second data sub-block 23, and the third data sub-block 24, the server can determine, according to the index file type and the mapping relationship, that a characteristic of data in the first data sub-block is the first characteristic, a characteristic of data in the second data sub-block is the second characteristic, and a characteristic of data in the third data sub-block is the third characteristic.

Optionally, after the server obtains the file type of the data in the data block and the data sub-block that is included in the data block, if the server does not configure the mapping relationship between the file type and the characteristic of the data in the data sub-block, the server may not compress the data block or compress the data block by using a general compression algorithm.

It should be noted that, data of some file types is inappropriate for compression. For example, for data of a file type, which has a relatively small data volume but needs to be frequently accessed, storage space saved by compressing the data is limited but a latency of reading the data is increased instead. In this embodiment of the present disclosure, the server may compress data of some types but does not compress data of some types according to an actual requirement, so that the compression is more flexible.

S103. The server selects, according to the characteristic, a target compression algorithm that is used to compress the data in the data sub-block.

It should be noted that different compression algorithms are appropriate for data with different characteristics. For example, for a large volume of repeated data, highest compression efficiency is achieved by using a run length encoding (RLE) algorithm. However, for data with a consecutive row address, highest compression efficiency is achieved by using an incremental compression encoding algorithm.

In a possible implementation manner of this embodiment of the present disclosure, the foregoing step S103 specifically includes:

the server determines multiple candidate compression algorithms corresponding to the characteristic, and selects the target compression algorithm from the multiple candidate compression algorithms.

That is, in this embodiment of the present disclosure, the multiple candidate compression algorithms may be preset for the characteristic of the data. Exemplarily, the server configures a correspondence between the characteristic of the data and a candidate compression algorithm. The server queries for the correspondence according to the characteristic of the data in the data sub-block to determine the multiple candidate compression algorithms for compression of the data in the data sub-block.

Further, the server may use the following implementation manner to select the target compression algorithm from the multiple candidate compression algorithms:

the server pre-compresses the data in the data sub-block according to each candidate compression algorithm of the multiple candidate compression algorithms, obtains compression efficiency of pre-compressing, by using each candidate compression algorithm, the data in the data sub-block, and selects a candidate compression algorithm with highest compression efficiency as the target compression algorithm. In this way, it is ensured that compression efficiency for compression of the data in the data sub-block is the highest finally.

Exemplarily, the compression efficiency may refer to a data compression speed. In this case, the server samples data in the data sub-block, and compresses the sampled data by using each candidate compression algorithm, then calculates a compression speed for each candidate compression algorithm, and then compares the compression speeds for all the candidate compression algorithms to determine a candidate compression algorithm with a highest compression speed as the target compression algorithm.

In another example, the compression efficiency may refer to a data compression ratio. In this case, the server samples data in the data sub-block, and compresses the sampled data by using each candidate compression algorithm, then calculates a ratio of a volume of the sampled data before compression to a volume of the sampled data after each compression, to obtain a compression ratio for each candidate compression algorithm, and then compares the compression ratios for all the candidate compression algorithms to determine a candidate compression algorithm with a largest compression ratio as the target compression algorithm.

The foregoing is only exemplarily described. The compression efficiency may be obtained by means of calculation based on the compression speed and the compression ratio, which is not limited in this embodiment of the present disclosure.

S104. The server compresses the data in the data sub-block by using the target compression algorithm.

By using the foregoing method, for data with different characteristics in a data block, a server may use different compression algorithms for compression. Compared with the prior art in which the server can use only one compression algorithm to compress data with a particular characteristic in the data block, a compression ratio for the data in the data block is improved by using this embodiment of the present disclosure.

It should be noted that the data block described in step S101 to step S104 may be a data block in a memory of the server. After the server receives data from another device that is connected to the server, the server may write the data into the data block of the memory, and after the server compresses the data in the data block by performing the foregoing step S101 to step S104, the server writes the compressed data into a storage medium of the server; or the server may write data into the data block of the memory after the server reads the data from a storage medium of the server, and then compress the data in the data block by performing the foregoing step S101 to step S104.

Step S101 to step S104 of the method shown in FIG. 1 may be considered as a method process for compressing data in a data sub-block in a data block. In an actual using process, one data block may include multiple data sub-blocks, and that the data block includes a first data sub-block and a second data sub-block is used as an example. In this case, step S102 specifically includes: the server separately determines a characteristic of data in the first data sub-block and a characteristic of data in the second data sub-block; step S103 specifically includes: the server selects, according to the characteristic of the data in the first data sub-block, a first target compression algorithm that is used to compress the data in the first data sub-block, and selects, according to the characteristic of the data in the second data sub-block, a second target compression algorithm that is used to compress the data in the second data sub-block; and step S104 specifically includes: the server compresses the data in the first data sub-block by using the first target compression algorithm, and compresses the data in the second data sub-block by using the second target compression algorithm.

Figure 3:
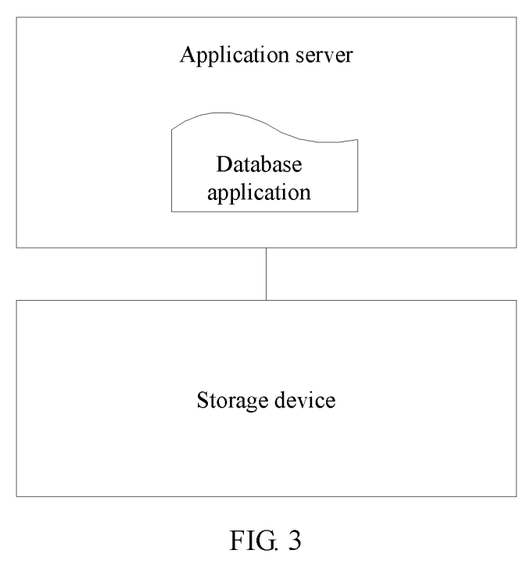
FIG. 3 is a schematic diagram of a connection between an application server and a storage device according to an embodiment of the present disclosure.
Figure 4A:
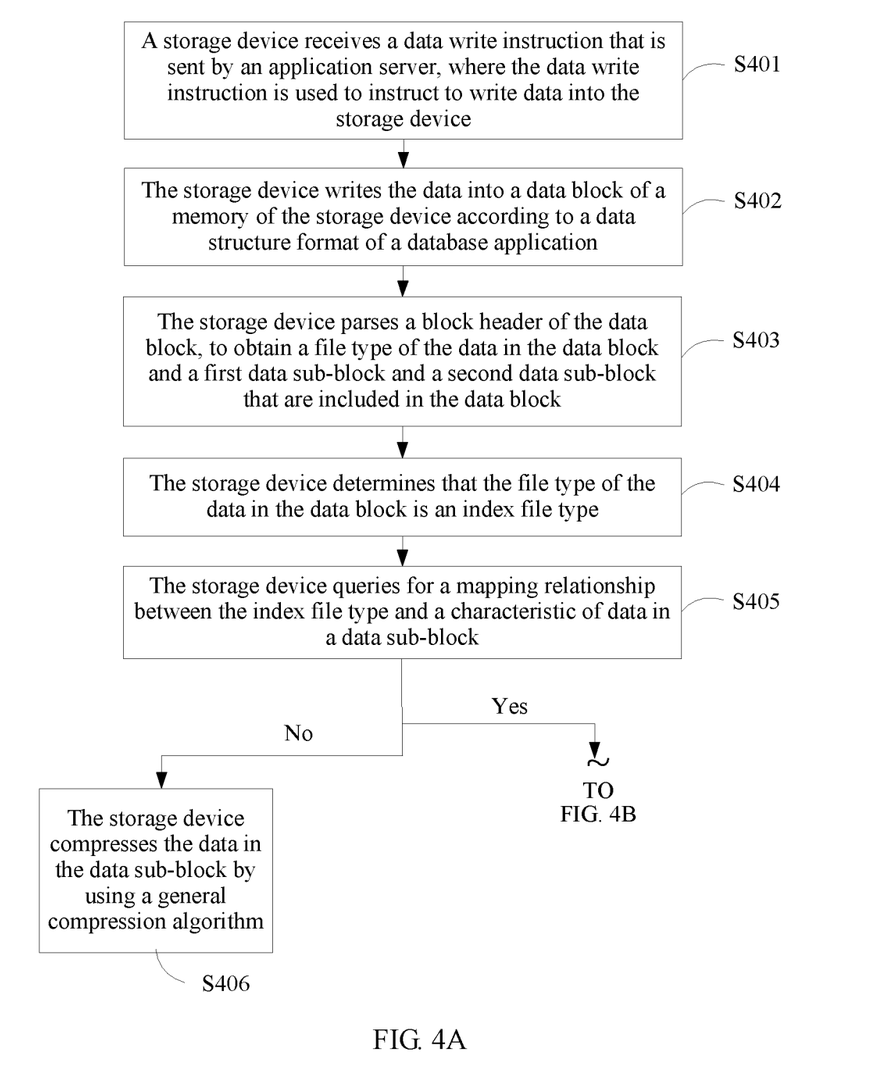
FIG. 4A and FIG. 4B show an example in which the storage device shown in FIG. 3 compresses received data that is sent by the application server.
Figure 4B:
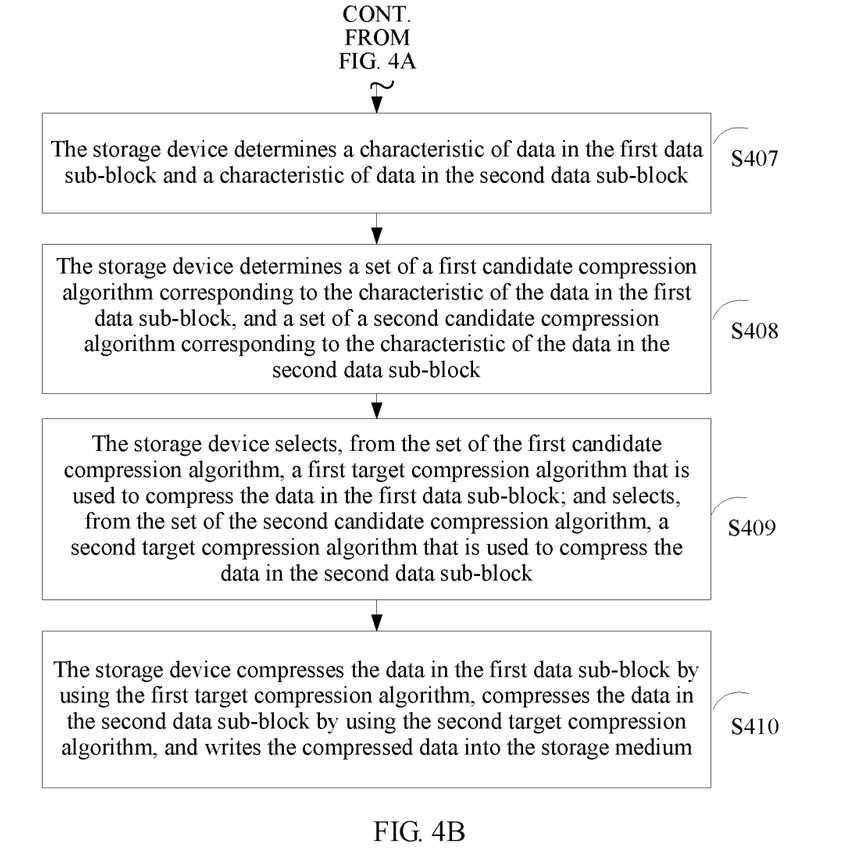

To help a person of ordinary skill in the art understand the technical solutions provided in the embodiments of the present disclosure better, the following describes, with reference to a specific scenario, a method for compressing data by a server according to an embodiment of the present disclosure. As shown in FIG. 3, an application server is connected to a storage device, and a database application runs on the application server. In this case, the storage device may be the server described in the method embodiment shown in FIG. 1. In another scenario, the application server may perform steps in this embodiment of the present disclosure. That is, the application server is used as the server described in the method embodiment shown in FIG. 1. The following describes, based on the storage device shown in FIG. 3, a method in which the storage device stores, into a storage medium, received data that is sent by the application server. As shown in FIG. 4A and FIG. 4B, the method includes the following steps:

S401. The storage device receives a data write instruction that is sent by the application server, where the data write instruction is used to instruct to write data into the storage device.

S402. The storage device writes the data into a data block of a memory of the storage device according to a data structure format of the database application.

S403. The storage device parses a block header of the data block, to obtain a file type of the data in the data block and a first data sub-block and a second data sub-block that are included in the data block.

S404. The storage device determines that the file type of the data in the data block is an index file type.

It should be noted that the file type includes at least one of the following: an index file type, a data file type, a log file type, or a control file type.

In this embodiment of the present disclosure, only the data block of the index file type is used as an example for description. For a method for compressing data in a case of another file type, reference may be made to this embodiment of the present disclosure, which is not listed one by one herein.

S405. The storage device queries for a mapping relationship between the index file type and a characteristic of data in a data sub-block.

If the mapping relationship does not exist, step S406 is performed. If the mapping relationship exists, step S407 to step S410 are performed.

S406. The storage device compresses the data in the data sub-block by using a general compression algorithm.

Exemplarily, when the general compression algorithm is a dictionary compression algorithm, the server scans the data in the data sub-block byte by byte, determines a character string that occurs consecutively and repeatedly in the data sub-block, and compresses the character string that occurs consecutively and repeatedly. It should be noted that the general compression algorithm may not be necessarily appropriate for the data in the data sub-block. For example, if the character string that occurs consecutively and repeatedly does not exist in the data sub-block, a compression ratio at which the data in the data sub-block is compressed is zero by using the dictionary compression algorithm. Therefore, optionally, when the storage device determines that the mapping relationship between the index file type and the characteristic of the data in the data sub-block does not exist, the server may directly not compress the data in the data sub-block.

S407. The storage device determines a characteristic of data in the first data sub-block and a characteristic of data in the second data sub-block.

For step S407, reference may be made to a specific description of step S102 in the method embodiment shown in FIG. 1, and details are not described herein.

S408. The storage device determines a set of a first candidate compression algorithm corresponding to the characteristic of the data in the first data sub-block, and a set of a second candidate compression algorithm corresponding to the characteristic of the data in the second data sub-block.

The set of the first candidate compression algorithm includes at least one candidate compression algorithm, and the set of the second candidate compression algorithm includes at least one candidate compression algorithm.

S409. The storage device selects, from the set of the first candidate compression algorithm, a first target compression algorithm that is used to compress the data in the first data sub-block; and selects, from the set of the second candidate compression algorithm, a second target compression algorithm that is used to compress the data in the second data sub-block.

Specifically, the storage device selects, from multiple candidate compression algorithms, a candidate compression algorithm with highest compression efficiency to compress the data sub-block. Reference is made to a specific description of step S103 in the method embodiment shown in FIG. 1, and details are not described herein.

S410. The storage device compresses the data in the first data sub-block by using the first target compression algorithm, compresses the data in the second data sub-block by using the second target compression algorithm, and writes the compressed data into the storage medium.

In this way, the storage device can compress all data sub-blocks with different data characteristics. Compared with the prior art in which a server can use only one compression algorithm to compress data with a particular characteristic in a data block, a compression ratio for the data is improved and storage space is saved by using this embodiment of the present disclosure.

Figure 5:
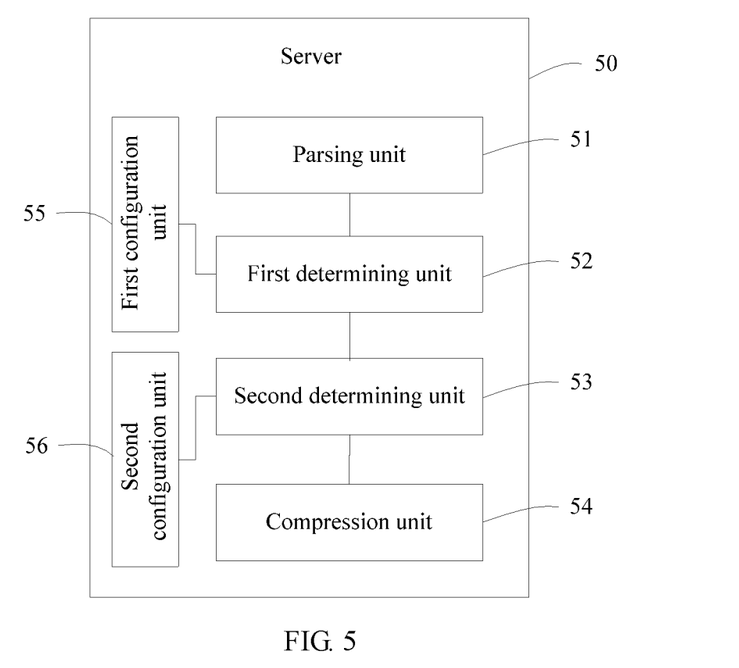
FIG. 5 is a schematic structural diagram of a server according to an embodiment of the present disclosure.

An embodiment of the present disclosure further provides a server 50, configured to implement the foregoing method embodiments As shown in FIG. 5, the server 50 includes:

a parsing unit 51, configured to parse an information block in a data block, to obtain a file type of data in the data block and a data sub-block that is included in the data block; a first determining unit 52, configured to determine a characteristic of data in the data sub-block according to the file type; a second determining unit 53, configured to select, according to the characteristic, a target compression algorithm that is used to compress the data in the data sub-block; and a compression unit 54, configured to compress the data in the data sub-block by using the target compression algorithm.

Optionally, the server 50 further includes a first configuration unit 55, configured to configure a mapping relationship between the file type and the characteristic of the data in the data sub-block according to a data structure format of an application. For a process for configuring the mapping relationship by the first configuration unit 55, reference may specifically be made to the specific description of step S102 in the method embodiment, and details are not described herein. The first determining unit 52 is specifically configured to query for the mapping relationship between the file type and the characteristic of the data in the data sub-block, to determine the characteristic of the data in the data sub-block.

Optionally, the server 50 further includes a second configuration unit 56, configured to configure a correspondence between the characteristic of the data in the data sub-block and multiple candidate compression algorithms. The second determining unit 53 is specifically configured to: determine the multiple candidate compression algorithms corresponding to the characteristic, and select the target compression algorithm from the multiple candidate compression algorithms. Specifically, reference is made to the specific description of step S103 in the method embodiment, and details are not described herein.

Optionally, the data block includes a first data sub-block and a second data sub-block. The first determining unit 52 is specifically configured to separately determine a characteristic of data in the first data sub-block and a characteristic of data in the second data sub-block according to the file type. The second determining unit 53 is specifically configured to: select, according to the characteristic of the data in the first data sub-block, a first target compression algorithm that is used to compress the data in the first data sub-block; and select, according to the characteristic of the data in the second data sub-block, a second target compression algorithm that is used to compress the data in the second data sub-block. The compression unit 54 is specifically configured to: compress the data in the first data sub-block by using the first target compression algorithm, and compress the data in the second data sub-block by using the second target compression algorithm.

Optionally, the second determining unit 53 is further configured to: pre-compress the data in the data sub-block by using each candidate compression algorithm of the multiple candidate compression algorithms; obtain compression efficiency of pre-compressing, by using each candidate compression algorithm, the data in the data sub-block; and select a candidate compression algorithm with highest compression efficiency as the target compression algorithm.

Optionally, the file type includes at least one of the following:

an index file type, a data file type, a log file type, or a control file type.

Optionally, the characteristic of the data in the data sub-block includes at least one of the following:

a first characteristic that is used to indicate that a quantity of single characters that occur consecutively and repeatedly in the data sub-block is greater than a first threshold, a second characteristic that is used to indicate that the data in the data sub-block increases or decreases progressively, or a third characteristic that is used to indicate that a quantity of character strings that occur consecutively and repeatedly in the data sub-block is greater than a second threshold.

It should be noted that, the foregoing division for functional units of the server is merely logical function division and may be other division in actual implementation. In addition, there may be also multiple implementation manners for physical implementation of the foregoing functional units. For example, the determining units may be specifically central processing units, or may be application-specific integrated circuits (ASIC).

In addition, it may be clearly understood by a person skilled in the art that, for the purpose of convenient and brief description, for a detailed working process of each unit in the foregoing server, reference may be made to a corresponding process in the foregoing method embodiments, and details are not described herein.

By using the server, for data with different characteristics in a data block, the server may use different compression algorithms for compression. Compared with the prior art in which the server uses only one compression algorithm to compress data with a particular characteristic in the data block, a compression ratio for the data in the data block is improved by using this embodiment of the present disclosure.

Figure 6:
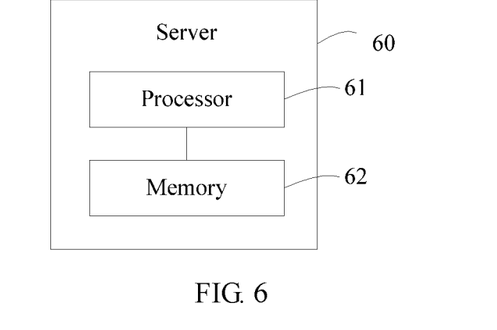
FIG. 6 is a schematic structural diagram of another server according to an embodiment of the present disclosure.

An embodiment of the present disclosure further provides another server 60, configured to implement the method for compressing data provided in the foregoing embodiments. As shown in FIG. 6, the server 60 includes: a processor 61 and a memory 62, where the processor 61 communicates with the memory 62. The memory 62 is configured to store data in a data block, and the processor 61 is configured to:

parse an information block in the data block, to obtain a file type of the data in the data block and a data sub-block that is included in the data block;

determine a characteristic of data in the data sub-block according to the file type;

select, according to the characteristic, a target compression algorithm that is used to compress the data in the data sub-block; and compress the data in the data sub-block by using the target compression algorithm.

Optionally, the determining the characteristic of the data in the data sub-block according to the file type includes:

querying for a mapping relationship between the file type and the characteristic of the data in the data sub-block, to determine the characteristic of the data in the data sub-block, where the mapping relationship is configured according to a data structure format of an application.

Optionally, the selecting, according to the characteristic, the target compression algorithm that is used to compress the data in the data sub-block includes:

determining multiple candidate compression algorithms corresponding to the characteristic; and selecting the target compression algorithm from the multiple candidate compression algorithms.

Optionally, the selecting the target compression algorithm from the multiple candidate compression algorithms includes:

pre-compressing the data in the data sub-block by using each candidate compression algorithm of the multiple candidate compression algorithms;

obtaining compression efficiency of pre-compressing, by using each candidate compression algorithm, the data in the data sub-block; and selecting a candidate compression algorithm with highest compression efficiency as the target compression algorithm.

Optionally, the data block includes a first data sub-block and a second data sub-block, and the processor 61 is specifically configured to execute:

separately determining a characteristic of data in the first data sub-block and a characteristic of data in the second data sub-block according to the file type;

selecting, according to the characteristic of the data in the first data sub-block, a first target compression algorithm that is used to compress the data in the first data sub-block; and selecting, according to the characteristic of the data in the second data sub-block, a second target compression algorithm that is used to compress the data in the second data sub-block; and compressing the data in the first data sub-block by using the first target compression algorithm, and compressing the data in the second data sub-block by using the second target compression algorithm.

Optionally, the file type includes at least one of the following:

an index file type, a data file type, a log file type, or a control file type.

Optionally, the characteristic of the data in the data sub-block includes at least one of the following:

a first characteristic that is used to indicate that a quantity of single characters that occur consecutively and repeatedly in the data sub-block is greater than a first threshold, a second characteristic that is used to indicate that the data in the data sub-block increases or decreases progressively, or a third characteristic that is used to indicate that a quantity of character strings that occur consecutively and repeatedly in the data sub-block is greater than a second threshold.

The processor 61 in this embodiment of the present disclosure may be a central processing unit (CPU). In addition, to reduce a computation resource of the CPU, the processor 61 may be a field programmable gate array (FPGA) or another hardware, to implement all data compression operations in this embodiment of the present disclosure. Alternatively, the processor 61 may be a CPU and an FPGA or another hardware, where the FPGA or the another hardware and the CPU separately perform some data compression operations described in this embodiment of the present disclosure, to implement data compression operations described in this embodiment of the present disclosure. For ease of description, in this embodiment of the present disclosure, the foregoing is collectively described as follows: the processor 61 of the server implements a data compression operation in this embodiment of the present disclosure.

It should be noted that, the servers shown in FIG. 5 and FIG. 6 may be application servers on which an application runs. By using the method for compressing data provided in the foregoing method embodiments, after compressing data in a data block, the application servers may store the data into storage space of the application servers or storage space of a peripheral storage device. In addition, the servers shown in FIG. 5 and FIG. 6 may be peripheral storage devices of an application server. After the peripheral storage devices receive uncompressed data that is sent by the application server, the peripheral storage devices may store the data into storage space of the peripheral storage devices after compressing the data by using the method for compressing data provided in the foregoing method embodiments.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate. Parts displayed as units may or may not be physical units, and may be located in one position or may be distributed on multiple network units. Some or all of the units may be selected according to actual needs to achieve the objectives of the solutions of the embodiments.

In addition, functional units in the embodiments of the present disclosure may be integrated into one processing unit. Each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) to perform some of the steps of the methods described in the embodiments of the present disclosure. The storage medium includes any medium that can store data, such as a USB flash drive, a movable hard disk, a random access memory (RAM), a magnetic disk, or an optical disc.

What is claimed is:

1. A method for compressing data by a device, wherein the method comprises:
    parsing, by the device, an information block in a data block, to obtain a file type of data in the data block and a data sub-block that is comprised in the data block, wherein the file type comprises at least one of the following: an index file type, a data file type, a log file type, and a control file type;
    determining, by the device, a characteristic of data in the data sub-block according to the file type by querying, by the device, for a mapping relationship between the file type and the characteristic of the data in the data sub-block, to determine the characteristic of the data in the data sub-block, wherein the mapping relationship is configured according to a data structure format of an application, wherein the characteristic of the data in the data sub-block comprises at least one of the following: a first characteristic that is used to indicate that a quantity of single characters that occur consecutively and repeatedly in the data sub-block is greater than a first threshold, a second characteristic that is used to indicate that the data in the data sub-block increases or decreases progressively, and a third characteristic that is used to indicate that a quantity of character strings that occur consecutively and repeatedly in the data sub-block is greater than a second threshold;
  selecting, by the device according to the characteristic, a target compression algorithm that is used to compress the data in the data sub-block; and
  compressing, by the device, the data in the data sub-block by using the target compression algorithm.

2. The method according to claim 1, wherein the selecting, by the device according to the characteristic, a target compression algorithm that is used to compress the data in the data sub-block comprises:
  determining, by the device, multiple candidate compression algorithms corresponding to the characteristic; and
  selecting, by the device, the target compression algorithm from the multiple candidate compression algorithms.

3. The method according to claim 2, wherein the selecting, by the device, the target compression algorithm from the multiple candidate compression algorithms comprises:
  pre-compressing, by the device, the data in the data sub-block by using each candidate compression algorithm of the multiple candidate compression algorithms;
  obtaining, by the device, compression efficiency of pre-compressing, by using each candidate compression algorithm, the data in the data sub-block; and
  selecting, by the device, a candidate compression algorithm with highest compression efficiency as the target compression algorithm.

4. The method according to claim 1, wherein the data block comprises a first data sub-block and a second data sub-block;
  the determining, by the device, a characteristic of data in the data sub-block according to the file type comprises:
  separately determining, by the device, a characteristic of data in the first data sub-block and a characteristic of data in the second data sub-block according to the file type;
  the selecting, by the device according to the characteristic, a target compression algorithm that is used to compress the data in the data sub-block comprises:
  selecting, by the device according to the characteristic of the data in the first data sub-block, a first target compression algorithm that is used to compress the data in the first data sub-block; and selecting, according to the characteristic of the data in the second data sub-block, a second target compression algorithm that is used to compress the data in the second data sub-block; and
  the compressing, by the device, the data in the data sub-block by using the target compression algorithm comprises:
  compressing, by the device, the data in the first data sub-block by using the first target compression algorithm, and compressing the data in the second data sub-block by using the second target compression algorithm.

5. A data storage device, comprising:
  a memory configured to store data in a data block;
  a processor coupled to communicate with the memory, the processor is configured to perform the steps of:
  parsing an information block in the data block to obtain a file type of the data in the data block and a data sub-block that is comprised in the data block, wherein the file type comprises at least one of the following: an index file type, a data file type, a log file type, and a control file type;
  determining a characteristic of data in the data sub-block according to the file type by querying, by the device, for a mapping relationship between the file type and the characteristic of the data in the data sub-block, to determine the characteristic of the data in the data sub-block, wherein the mapping relationship is configured according to a data structure format of an application, wherein the characteristic of the data in the data sub-block comprises at least one of the following: a first characteristic that is used to indicate that a quantity of single characters that occur consecutively and repeatedly in the data sub-block is greater than a first threshold, a second characteristic that is used to indicate that the data in the data sub-block increases or decreases progressively, and a third characteristic that is used to indicate that a quantity of character strings that occur consecutively and repeatedly in the data sub-block is greater than a second threshold;
  selecting, according to the characteristic, a target compression algorithm that is used to compress the data in the data sub-block; and
  compressing the data in the data sub-block by using the target compression algorithm.

6. The data storage device according to claim 5, wherein the processor is specifically configured to perform the steps of:
  determining multiple candidate compression algorithms corresponding to the characteristic; and
  selecting the target compression algorithm from the multiple candidate compression algorithms.

7. The data storage device according to claim 6, wherein the processor is specifically configured to perform the steps of:
  pre-compressing the data in the data sub-block by using each candidate compression algorithm of the multiple candidate compression algorithms;
  obtaining compression efficiency of pre-compressing, by using each candidate compression algorithm, the data in the data sub-block; and
  selecting a candidate compression algorithm with highest compression efficiency as the target compression algorithm.

8. The data storage device according to claim 5, wherein the data block comprises a first data sub-block and a second data sub-block, and the processor is specifically configured to perform the steps of:
  separately determining a characteristic of data in the first data sub-block and a characteristic of data in the second data sub-block according to the file type;
  selecting, according to the characteristic of the data in the first data sub-block, a first target compression algorithm that is used to compress the data in the first data sub-block; and selecting, according to the characteristic of the data in the second data sub-block, a second target compression algorithm that is used to compress the data in the second data sub-block; and compressing the data in the first data sub-block by using the first target compression algorithm, and compressing the data in the second data sub-block by using the second target compression algorithm.

\* \* \* \* \*